(12) United States Patent
Xiong

(10) Patent No.: US 11,329,262 B2
(45) Date of Patent: May 10, 2022

(54) MANUFACTURING METHOD OF DISPLAY PANEL, AND ELECTRONIC EQUIPMENT

(71) Applicant: WUHAN CHINA STAR OPTOELECTRONICS SEMICONDUCTOR DISPLAY TECHNOLOGY CO., LTD., Hubei (CN)

(72) Inventor: Kun Xiong, Wuhan (CN)

(*) Notice: Subject to any disclaimer, the term of this patent is extended or adjusted under 35 U.S.C. 154(b) by 164 days.

(21) Appl. No.: 16/771,428

(22) PCT Filed: Nov. 8, 2019

(86) PCT No.: PCT/CN2019/116452
§ 371 (c)(1),
(2) Date: Jun. 10, 2020

(87) PCT Pub. No.: WO2021/031382
PCT Pub. Date: Feb. 25, 2021

(65) Prior Publication Data
US 2021/0408510 A1    Dec. 30, 2021

(30) Foreign Application Priority Data
Aug. 20, 2019   (CN) .......................... 201910771363.8

(51) Int. Cl.
*H01L 51/56*    (2006.01)
*H01L 51/00*    (2006.01)

(52) U.S. Cl.
CPC .......... *H01L 51/56* (2013.01); *H01L 51/0097* (2013.01)

(58) Field of Classification Search
None
See application file for complete search history.

(56) References Cited

U.S. PATENT DOCUMENTS

| 9,806,272 | B2* | 10/2017 | Seo | .......................... H01L 51/56 |
| 10,109,811 | B2* | 10/2018 | Seo | ..................... H01L 51/0097 |
| 2015/0255522 | A1* | 9/2015 | Sato | .................... H01L 51/0097 257/88 |
| 2017/0179207 | A1* | 6/2017 | Sato | ..................... H01L 51/003 |
| 2019/0229282 | A1 | 7/2019 | Zhang | |
| 2020/0235139 | A1 | 7/2020 | Ke | |
| 2021/0408510 | A1* | 12/2021 | Xiong | ................. H01L 51/0097 |

FOREIGN PATENT DOCUMENTS

| CN | 107068862 A | 8/2017 |
| CN | 107968109 A | 4/2018 |
| CN | 109326712 A | 2/2019 |
| CN | 109638056 A | 4/2019 |
| CN | 109659318 A | 4/2019 |

* cited by examiner

*Primary Examiner* — J. E. Schoenholtz
(74) *Attorney, Agent, or Firm* — JMB Davis Ben-David

(57) ABSTRACT

A manufacturing method of display panel, an electronic equipment, and a storage medium are provided. The method includes forming a buffer on at least one portion of a first base, wherein the first base is a substrate located in the bending area; forming a first flexible substrate on the buffer; forming display units on the first flexible substrate; and removing the buffer from the first flexible substrate, so that a groove is formed on the first flexible substrate at a position corresponding to the buffer.

17 Claims, 2 Drawing Sheets

MANUFACTURING METHOD OF DISPLAY PANEL, AND ELECTRONIC EQUIPMENT

CROSS-REFERENCE TO RELATED APPLICATIONS

This is the U.S. National Stage of International Patent Application No. PCT/CN2019/116452 filed Nov. 8, 2019, which in turn claims the benefit of Chinese Patent Application No 201910771363.8 filed Aug. 20, 2019.

FIELD OF INVENTION

The present disclosure relates to the technical field of display, and in particular, relates to a manufacturing method of display panel, an electronic equipment, and a storage medium.

BACKGROUND OF INVENTION

With the development of electronic devices, users have increasingly higher requirements for the screen-body ratios of display screens. The display screens are gradually developing towards full screens, thereby advancing the technology of the display screen.

To reduce the bezels of electronic devices, bending areas (Pad bending) are usually formed outside the display area of the display panel. By bending the bending areas to the back of the electronic device, a narrow bezel design is realized.

Technical Problem

However, the existing bending areas have a large stress during the bending process, so it is easy to cause the circuit in the bending area to break. As a result, it is necessary to provide a manufacturing method of display panel, an electronic equipment, and a storage medium to solve the defects existing in the conventional technology.

SUMMARY OF INVENTION

Technical Solution

An object of the present disclosure is to provide a manufacturing method of display panel, an electronic equipment, and a storage medium, which can prevent a disconnection of a circuit in a bending area.

To achieve the above object, the present disclosure provides a manufacturing method of a display panel, wherein the display panel includes a display area and a bending area, and the manufacturing method comprises steps of:

forming a buffer on at least one portion of a first base, wherein the first base is a substrate located in the bending area, and the buffer is made by nano-imprinting or melting;

forming a release film on an upper surface of the buffer;

forming a first flexible substrate on the buffer having the release film;

forming display units on the first flexible substrate; and removing the release film to separate the buffer from the first flexible substrate, so that a groove is formed on the first flexible substrate at a position corresponding to the buffer.

The present disclosure further provides a manufacturing method of a display panel, wherein the display panel includes a display area and a bending area, and the manufacturing method comprises steps of:

forming a buffer on at least one portion of a first base, wherein the first base is a substrate located in the bending area;

forming a first flexible substrate on the buffer;

forming display units on the first flexible substrate; and removing the buffer from the first flexible substrate, so that a groove is formed on the first flexible substrate at a position corresponding to the buffer.

The present disclosure further provides an electronic equipment, including a controller and a memory configured to store instructions, wherein the controller is configured to execute the instructions to implement said manufacturing method of the display panel.

The present disclosure further provides a storage medium, wherein at least one instruction is stored in the storage medium, and the instruction is loaded and executed by a processor to implement the manufacturing method of the display panel.

Beneficial Effects

The present disclosure is to provide a manufacturing method of display panel, an electronic equipment, and a storage medium. By forming the buffer on at least one portion of the first base, forming the first flexible substrate on the buffer, forming the display units on the first flexible substrate, and removing the buffer from the first flexible substrate, the grooves are formed on the first flexible substrate at a position corresponding to the buffer. Since the grooves are formed on the first flexible substrate at a position corresponding to the buffer, the bending stress in the bending area is alleviated, and the circuit in the bending area can be prevented from being broken.

DETAILED DESCRIPTION OF PREFERRED EMBODIMENTS

Structural and technical means adopted by the present disclosure to achieve the above and other objects can be best understood by referring to the following detailed description of the preferred embodiments and the accompanying drawings. Furthermore, directional terms described by the present disclosure, such as upper, lower, front, back, left, right, inner, outer, side, longitudinal/vertical, transverse/horizontal, etc., are only directions by referring to the accompanying drawings, and thus the used directional terms are used to describe and understand the present disclosure, but the present disclosure is not limited thereto.

Referring to FIG. 1 to FIG. 4, FIG. 1 is a schematic structural view of a first step of a manufacturing method of a display panel according to a first embodiment of the present disclosure.

A manufacturing method of a display panel according to an embodiment includes:

Step S101 of forming a buffer on at least one portion of a first base.

Figure 1:
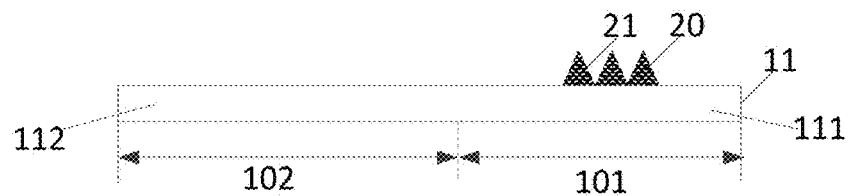
FIG. 1 is a schematic structural view of a first step of a manufacturing method of a display panel according to a first embodiment of the present disclosure.

For example, as shown in FIG. 1, the display panel includes a display area 101 and a bending area 102; a first substrate 11 includes the first base 111 and a second base 112, wherein the first base 111 is the substrate located in the bending area 102. The first base 111 corresponds to the position of the bending area 101, and the second base 112 corresponds to the position of the display area 102.

The buffer 20 formed on at least one portion of a first base 111, and the buffer 20 includes three buffer portion 21. The number of the buffer portion 21 may be one, two, or more. A shape of a longitudinal cross-section of the buffer portion 21 is at least one of a rectangle, a triangle, a semicircle, a trapezoid, and a polygon, or not limited to the above shapes. The buffer 20 is made by nano-imprinting, melting, or other way, and the buffer 20 can be stably adhered to the first substrate 11.

Step S102 of forming a first flexible substrate on the buffer.

Figure 2:
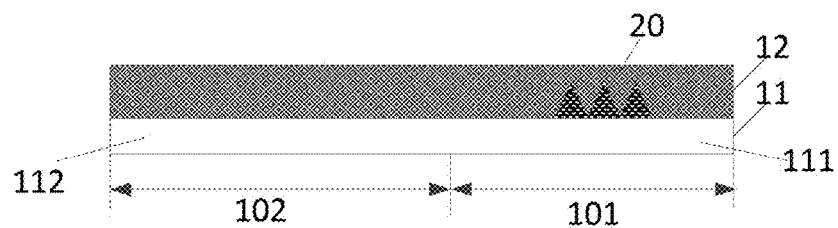
FIG. 2 is a schematic structural view of a second step of a manufacturing method of the display panel according to the first embodiment of the present disclosure.

For example, as shown in FIG. 2, the first flexible substrate 12 is formed on the buffer 20, and the material of the first substrate 12 may be polyimide (PI).

Step S103 of forming display units on the first flexible substrate.

Figure 3:
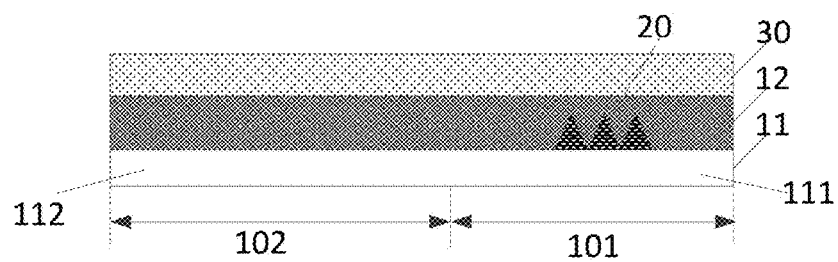
FIG. 3 is a schematic structural view of a third step of a manufacturing method of the display panel according to the first embodiment of the present disclosure.

For example, as shown in FIG. 3, The display units 30 are formed on the first flexible substrate 12, wherein the display units 30 include a switch array layer, or an organic light emitting display layer. The switch array layer includes a plurality of thin film transistors, and the organic light emitting display layer includes an anode, an organic light emitting layer, and a cathode.

Step S104 of removing the buffer from the first flexible substrate, so that a groove is formed on the first flexible substrate at a position corresponding to the buffer.

Figure 4:
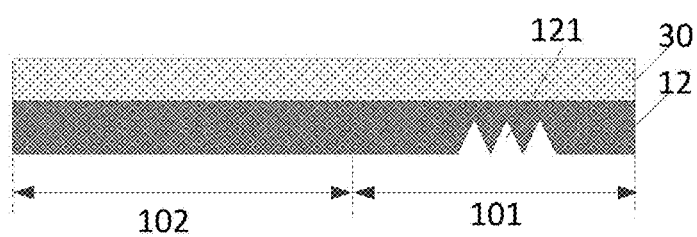
FIG. 4 is a schematic structural view of a fourth step of a manufacturing method of the display panel according to the first embodiment of the present disclosure.

For example, as shown in FIG. 4, in one embodiment, the substrate 11 and the buffer 20 can be removed from the first flexible substrate 12, so that a plurality of grooves 121 are formed on the first flexible substrate 12 at a position corresponding to the buffer 20, wherein the number of the grooves 121 corresponds to the number of the buffer portion 21.

Since the buffer is formed on the portion of the first base, the groove are formed on the first flexible substrate at the position corresponding to the buffer, so that the bending stress in the bending area can be relieved, and the circuit in the bending area can be prevented from being broken.

Figure 5:
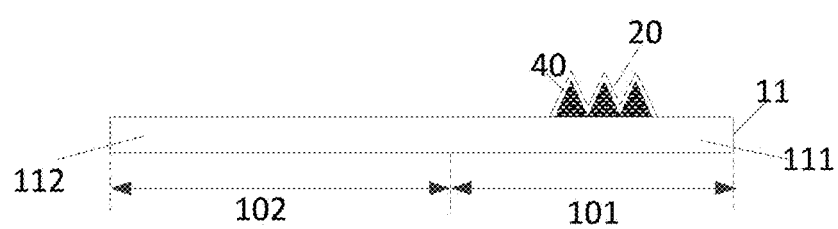
FIG. 5 is a schematic structural view of a second step of a manufacturing method of the display panel according to a second embodiment of the present disclosure.

Referring to FIG. 5, a schematic structural view of a second step of a manufacturing method of the display panel according to a second embodiment of the present disclosure is illustrated.

The manufacturing method of a display panel according to the embodiment includes:

Step S201 of forming a buffer on at least one portion of a first base, wherein the first base is a substrate located in the bending area.

Step S202 of forming a release film on an upper surface of the buffer.

For example, as shown in FIG. 5, the release film 40 is formed on the upper surface of the buffer 20, wherein the release film 40 may be a metal, a metal oxide, an organic material, a non-organic material, or the like, and the release film 40 may be a substance that is dissolved or melted after a reaction in certain specific environments, so as to facilitate peeling of the release film 40.

Step S203 of forming a first flexible substrate on the buffer.

In other words, the first flexible substrate is formed on the buffer having the release film.

Step S204 of forming display units on the first flexible substrate.

Step S205 of removing the release film to separate the buffer from the first flexible substrate.

For example, in one embodiment, the step of removing the release film 40 includes dissolving or melting the release film 40 to remove the release film 40.

Step S201 and Step S204 are respectively the same as the first and third steps in the first embodiment, respectively.

Since the release film is formed on the upper surface of the buffer, it is convenient to peel the buffer from the first flexible substrate and prevent the flexible substrate from being damaged.

Figure 6:
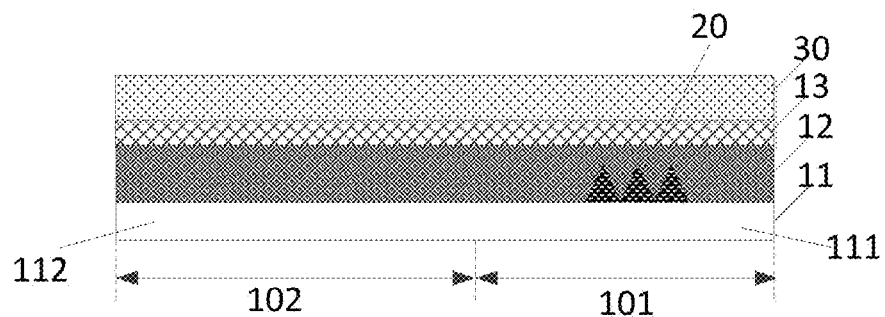
FIG. 6 is a schematic structural view of the second and fourth steps of a manufacturing method of the display panel according to a third embodiment of the present disclosure.
Figure 7:
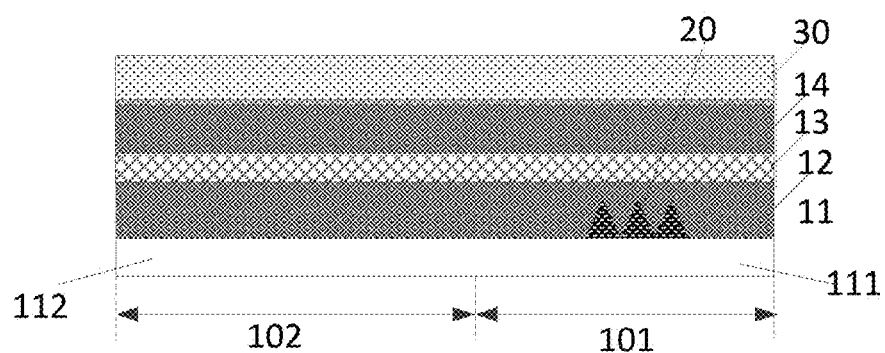
FIG. 7 is a schematic structural view of a preferred structure of a fourth step of a manufacturing method of the display panel according to a third embodiment of the present disclosure.

Referring to FIG. 6 and FIG. 7, FIG. 6 is a schematic structural view of the second and fourth steps of a manufacturing method of the display panel according to a third embodiment of the present disclosure.

The manufacturing method of the display panel according to the embodiment includes:

Step S301 of forming a buffer on at least one portion of a first base;

Said step is same as step S101.

Step S302 of forming a first flexible substrate on the buffer;

Said step is same as step S102.

Step S303 of forming a barrier layer on the first flexible substrate;

For example, in the above S303, as shown in FIG. 6, the barrier layer 13 is formed on the first flexible substrate 12, and the barrier layer 13 is used to block water and oxygen.

Step S304 of forming display units on the barrier layer;

For example, the display units 30 are formed on the barrier layer 13.

In order to further prevent the circuit in the bending area from being broken, the above S304 may further includes:

Step S3041, in which a second flexible substrate is formed on the barrier layer;

Step S3042, in which the display units are formed on the second flexible substrate.

For example, as shown in FIG. 7, the second flexible substrate 14 is formed on the barrier layer 13, and the display units 30 are formed on the second flexible substrate 14.

S305, removing the buffer from the first flexible substrate, so that a plurality grooves are formed on the first flexible substrate at a position corresponding to the buffer. Said step is the same as step S104.

Figure 8:
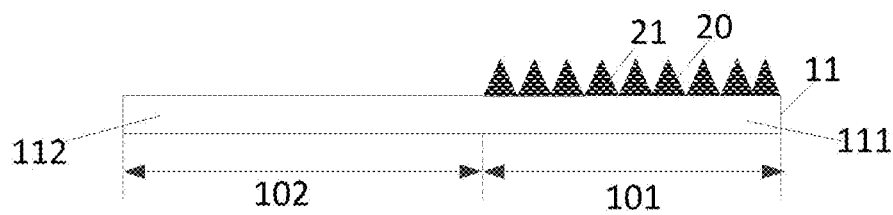
FIG. 8 is a schematic structural view of a first step of a manufacturing method of the display panel according to a fourth embodiment of the present disclosure.
Figure 9:
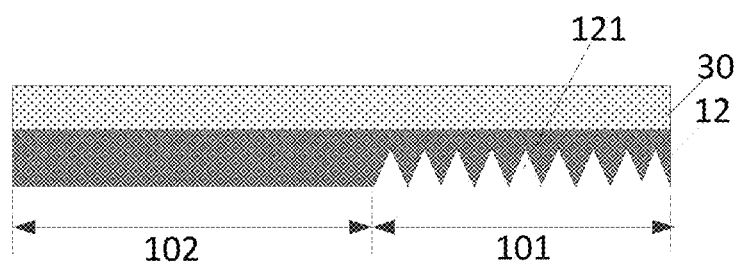
FIG. 9 is a schematic structural view of the display panel according to a fourth embodiment of the present disclosure.

Referring to FIG. 8 and FIG. 9, FIG. 8 is a schematic structural view of a first step of a manufacturing method of the display panel according to a fourth embodiment of the present disclosure.

As shown in FIG. 8 and FIG. 9, the manufacturing method of the display panel of the embodiment is different from that of the first embodiment in that: the first step of them are different. The manufacturing method of the embodiment includes:

Step S401 of forming the buffer on the entire first base, wherein the first base is a substrate located in the bending area;

For example, as shown in FIG. 8, the display panel includes a bending area 101 and a display area 102. The first substrate includes a first base 111 and a second base 112. The first base 111 is the substrate located in the bending area 101, and the second base 112 corresponds to the position of the display area 102.

Such as the buffer 20 is formed on entire first base 111.

Step S402 of forming a first flexible substrate on the buffer.

Step S403 of forming display units on the first flexible substrate;

Step S404 of removing the buffer from the first flexible substrate, so that a groove is formed on the first flexible substrate at a position corresponding to the buffer.

For example, as shown in FIG. 9, in one embodiment, the substrate 11 and the buffer 20 can be removed from the first flexible substrate 12, so that a plurality of grooves 121 are formed on the first flexible substrate 12 at a position corresponding to the buffer 20.

Since the buffer is formed on the entire first base, so that the grooves are formed on the first flexible substrate at a position corresponding to the buffer, the bending stress in the bending area is alleviated, and the circuit in the bending area can be prevented from being broken.

In summary, although the present disclosure has been disclosed as above with preferred embodiments, however, the foregoing preferred embodiments are not intended to limit the present disclosure. Those of ordinary skill in the art can make various modifications and decorations without departing from the spirit and scope of this present disclosure. Therefore, the protection scope of this present disclosure is subject to the scope defined by the claims.

What is claimed is:

1. A manufacturing method of a display panel, wherein the display panel includes a display area and a bending area, and the manufacturing method comprises steps of:
   forming a buffer on at least one portion of a first base, wherein the first base is a substrate located in the bending area, and the buffer is made by nano-imprinting or melting;
   forming a release film on an upper surface of the buffer;
   forming a first flexible substrate on the buffer having the release film;
   forming display units on the first flexible substrate; and
   removing the release film to separate the buffer from the first flexible substrate, so that a groove is formed on the first flexible substrate at a position corresponding to the buffer.

2. The manufacturing method of the display panel according to claim 1, wherein the step of removing the release film includes:
   dissolving or melting the release film to remove the release film.

3. The manufacturing method of the display panel according to claim 1, wherein the buffer includes at least one buffer portion, and the number of the groove corresponds to the number of the buffer portion.

4. The manufacturing method of the display panel according to claim 3, wherein a shape of a longitudinal cross-section of the buffer portion is at least one of a rectangle, a triangle, a semicircle, a trapezoid, and a polygon.

5. The manufacturing method of the display panel according to claim 1, wherein the step of forming the buffer on the at least one portion of the first base includes:
   forming the buffer on the entire first base.

6. The manufacturing method of the display panel according to claim 1, wherein the step of forming the display units on the first flexible substrate includes:
   forming a barrier layer on the first flexible substrate; and
   forming the display units on the barrier layer.

7. The manufacturing method of the display panel according to claim 6, wherein the step of forming the display units on the barrier layer includes:
   forming a second flexible substrate on the barrier layer; and
   forming the display units on the second flexible substrate.

8. A manufacturing method of a display panel, wherein the display panel includes a display area and a bending area, and the manufacturing method comprises steps of:
   forming a buffer on at least one portion of a first base, wherein the first base is a substrate located in the bending area;
   forming a first flexible substrate on the buffer;
   forming display units on the first flexible substrate; and
   removing the buffer from the first flexible substrate, so that a groove is formed on the first flexible substrate at a position corresponding to the buffer.

9. The manufacturing method of the display panel according to claim 8, wherein before the step of forming a first flexible substrate on the buffer, the manufacturing method further includes:
   forming a release film on an upper surface of the buffer;
   the step of removing the buffer from the first flexible substrate includes:
   removing the release film to separate the buffer from the first flexible substrate.

10. The manufacturing method of the display panel according to claim 9, wherein the step of removing the release film includes:
    dissolving or melting the release film to remove the release film.

11. The manufacturing method of display panel according to claim 8, wherein the buffer includes at least one buffer portion, and the number of the groove corresponds to the number of the buffer portion.

12. The manufacturing method of the display panel according to claim 11, wherein a shape of a longitudinal cross-section of the buffer portion is at least one of a rectangle, a triangle, a semicircle, a trapezoid, and a polygon.

13. The manufacturing method of the display panel according to claim 8, wherein the step of forming the buffer on the at least one portion of a first base includes:
    forming the buffer on the entire first base.

14. The manufacturing method of the display panel according to claim 8, wherein the step of forming the display units on the first flexible substrate includes:
    forming a barrier layer on the first flexible substrate; and
    forming the display units on the barrier layer.

15. The manufacturing method of the display panel according to claim 14, wherein the step of forming the display units on the barrier layer includes:
    forming a second flexible substrate on the barrier layer; and
    forming the display units on the second flexible substrate.

16. The manufacturing method of the display panel according to claim 8, wherein the buffer is made by nano-imprinting or melting.

17. An electronic equipment, including a controller and a memory configured to store instructions, wherein the controller is configured to execute the instructions to implement the manufacturing method of the display panel according to claim 1.

\* \* \* \* \*